United States Patent [19]

Hwang

[11] Patent Number: 5,684,317
[45] Date of Patent: Nov. 4, 1997

[54] MOS TRANSISTOR AND METHOD OF MANUFACTURING THEREOF

[75] Inventor: Hyun Sang Hwang, Seoul, Rep. of Korea

[73] Assignee: L.G. Electronics Inc., Chungcheongbuk-do, Rep. of Korea

[21] Appl. No.: 483,699

[22] Filed: Jun. 7, 1995

[30] Foreign Application Priority Data

Jul. 30, 1994 [KR] Rep. of Korea .................. 18892/1994

[51] Int. Cl.$^6$ .................................................. H01L 29/78
[52] U.S. Cl. .......................... 257/316; 257/321; 257/339; 257/389
[58] Field of Search ........................... 257/339, 315, 257/316, 356, 389, 321, 322

[56] References Cited

U.S. PATENT DOCUMENTS

| | | | |
|---|---|---|---|
| 4,288,801 | 9/1981 | Ronen | 257/339 |
| 4,748,134 | 5/1988 | Holland et al. | 437/62 |
| 5,126,809 | 6/1992 | Hirai | 257/316 |
| 5,172,196 | 12/1992 | Matsukawa et al. | 257/316 |

Primary Examiner—Donald Monin
Attorney, Agent, or Firm—Finnegan, Henderson, Farabow, Garrett & Dunner, L.L.P.

[57] ABSTRACT

A thick oxide layer is formed over a drain region of an MOS transistor while a thin oxide layer is provided over the source and channel regions. As a result both improved current driving ability and reduced gate induced drain leakage current are achieved.

8 Claims, 6 Drawing Sheets 5,684,317

MOS TRANSISTOR AND METHOD OF MANUFACTURING THEREOF

FIELD OF THE INVENTION

This invention relates to an MOS transistor and a related method of making an MOS transistor thereof, in which device leakage current is reduced, while maintaining suitable driving current.

BACKGROUND OF THE INVENTION

Current driving capability (i.e., saturation current) and gate-induced drain leakage (GIDL) are two device parameters that can effect the performance of an MOS transistor. Current driving capability is a function of source resistance and the gate oxide thickness and can be improved by providing a thin gate oxide. GIDL, on the other hand, which is caused by band-to-band tunneling in that portion of the gate that overlaps the drain region, is improved by providing a relatively thick gate oxide film where the gate overlaps the drain. GIDL has made it difficult to provide smaller devices having suitable performance characteristics. In particular, although recent developments in VLSI fabrication techniques have resulted in scaled down device structures having reduced gate oxide thickness, higher GIDL currents, resulting from the reduced gate oxide thickness, have been observed in these device structures.

One technique for reducing GIDL currents involves a symmetrical oxidation process in which a thick gate oxide is provided in regions of gate-source and gate-drain overlap. The thick gate oxide is formed on opposite sides of an etched polysilicon gate electrode (see detailed discussion below) by a polysilicon oxidation process. Although this technique increases the gate oxide thickness adjacent the drain region and therefore reduces GIDL currents, it also increases the thickness of the gate oxide adjacent the source region, which, in turn, increases the source resistance. Driving current, which is related to the source resistance, is therefore reduced.

The above-described symmetrical oxidation process yields improved GIDL currents, but poor driving current characteristics. It has therefore been difficult to provide a scaled down MOS transistor having both suitable GIDL and driving currents characteristics.

A cross-sectional view of a conventional MOS transistor having a symmetrically oxidized structure is shown in FIG. 1. This transistor includes source/drain regions 15 and 16 separated by a channel region 17, each formed in the surface of semiconductor substrate 11. A gate insulation film 12 is formed over channel region 17. Portion 12-1 of the gate insulation film overlying channel region 17, tox1, is less than the thickness of portion 12-2 (formed by polysilicon oxidation) overlying source and drain region 15 and 16, tox2. As further shown in FIG. 1, a gate electrode 13 is formed on gate insulation film 12.

A process for fabricating the transistor shown in FIG. 1 will now be described with reference to FIGS. 2(a) to 2(c).

As shown in FIG. 2(a), oxide film 12-1 is grown on a p-type semiconductor substrate 11 by thermal oxidation. A polysilicon film is then deposited on oxide film 12-1. The polysilicon film is then patterned by a photoetching process to form gate electrode 13, leaving exposed portions of oxide 12-1.

As seen in FIG. 2(b), a polysilicon oxidation process is then performed at a relatively low temperature (850°–900°C), the exposed oxide films on both sides of the gate are oxidized to form thicker oxide films 12-2.

Referring to FIG. 2(c), n+ type source/drain regions 15 and 16 are formed in the substrate beneath the thicker oxide films 12-2 by ion implantation of n-type impurity ions 14. During this step, gate 13 is used as an implantation mask. Accordingly, a gate insulation film 12 having portion 12-1 with a thickness tox1 is formed beneath gate 13 and oxide films 12-2 having a thickness tox2 is formed over source and drain regions 15 and 16, the thickness tox1 being less than the thickness tox2. In addition, the device formed by the above-described polysilicon oxidation process is symmetrical in that thick oxide films are formed on both sides of gate 13.

As noted above, this process yields an MOS transistor device having reduced GIDL current (due to thicker oxide 12-2 over the drain region than thin oxide 12-1) but poor driving current characteristics (due to the same thick oxide 12-2 over the source region creating a high source resistance).

FIG. 3 illustrates a different type of symmetrical transistor which is used in a flash-EEPROM. This transistor is formed on a p-type substrate 21 and includes a channel region 29 formed between n+ source/drain regions 27 and 28, respectively. A gate insulation film is formed so as to overly both source and drain regions 27 and 28, as well as channel region 29. The portion of the gate insulation film overlying source and drain regions 27 and 28, oxide film 22-2, has a thickness tox4. The thickness of gate insulation film portion 22-1 above channel region 29, tox3, is less than tox4.

The symmetrical flash-EEPROM transistor shown in FIG. 3 further includes a charge storing floating gate 23 formed on the portion of the gate insulation film overlying the channel region. An interlayer insulation film 24 is sandwiched between floating gate 23 and control gate 25.

The transistor shown in FIG. 3 is termed "symmetrical" because thick oxide films 22-2 are provided over both the source and drain regions of the device.

The processing steps for forming the flash-EEPROM transistor shown in FIG. 3 include first growing an oxide film 22-1 on substrate 21 by thermal oxidation. A first polysilicon film is then deposited on oxide film 22-1, and then interlayer insulation and second polysilicon films are successively formed on the first polysilicon film. The first polysilicon film, interlayer film and the second polysilicon film are then patterned by a photoetching process. As a result, floating gate 23, interlayer insulation film 24 and control gate 25 are formed. A polysilicon oxidation process is then performed to produce thick oxide film portions 22-2 (i.e., thicker than oxide film portion 22-1) on opposite sides of the floating and control gates. N+ source and drain regions 27 and 28, respectively are formed by ion implantation of n-type impurities into the substrate using the control gate as an implantation mask.

Programming and erasing information in the flash-EEPROM transistor will now be described. During programming, a relatively high voltage is applied to control gate 25, causing a strong electric field to be formed beneath the control gate. This electric field creates hot electrons in a conductive region of channel region 29, which are induced onto the floating electrode 23 through oxide film 22-1. These electrons remain on the floating electrode and represent a bit of information to be stored in the flash-EEPROM. Information is erased by applying a relatively low voltage, causing electrons on the floating gate 23 to return to the channel region through oxide film 22-1.

The flash-EEPROM transistor shown in FIG. 3 suffers from disadvantages similar to those discussed above with respect to the transistor illustrated in FIG. 1. Namely, although GIDL currents are reduced because of the symmetrically formed thick oxide film, the device has low driving current characteristics because of the increased source resistance due to this thick oxide film overlying the source region.

SUMMARY OF THE INVENTION

An object of the present invention is to provide a high speed semiconductor element having reduced GIDL currents, while increasing the current driving capability of the semiconductor element.

An additional object of the present invention is to provide a flash-EEPROM transistor having high erasing and programming speeds and a simple junction structure. A further object of present invention is to provide a method for making a high speed semiconductor element and a flash-EEPROM transistor.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims. To achieve the objects and in accordance with the purpose of the invention, as embodied and broadly described herein, the invention comprises a semiconductor device including: a semiconductor substrate having a primary surface and a first conductivity type; a first semiconductor region being formed in the primary surface of the semiconductor substrate, the first semiconductor region having a second conductivity type; a second semiconductor region being formed in the primary surface of the semiconductor substrate spaced from the first semiconductor region, the second semiconductor region having the second conductivity type; and an insulation film formed on the primary surface, the insulation film having a first portion extending over the first semiconductor region and a second portion extending over the second semiconductor region, a thickness of the first portion of the insulation film being greater than a thickness of the second portion of the insulation film.

Further, in accordance with the present invention, a method for fabricating a semiconductor device is provided which comprises the steps of: growing an oxide layer on a primary surface of a semiconductor substrate having a first conductivity type, the oxide layer having a first portion having a first thickness and a second portion having a second thickness, the second thickness being greater than the first thickness; doping a first region in the primary surface of the semiconductor substrate with impurities having a second conductivity type beneath the first portion of the oxide layer; and doping a second region in the primary surface of the semiconductor substrate spaced from the first region and beneath the second portion of the oxide layer, with impurities having the second conductivity type.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE PREFERRED EMBODIMENT(S)

Reference will now be made in detail to the present preferred embodiments of the invention, examples of which are illustrated in the accompanying drawings. Wherever possible, the same reference numbers will be used throughout the drawings to refer to the same or like parts.

In accordance with the present invention, a thin oxide is preferably provided over the source region of an MOS transistor while a relatively thick oxide is preferably formed over the drain region. With this construction, an MOS transistor having both reduced GIDL currents and improved current driving ability can be realized.

Figure 1:
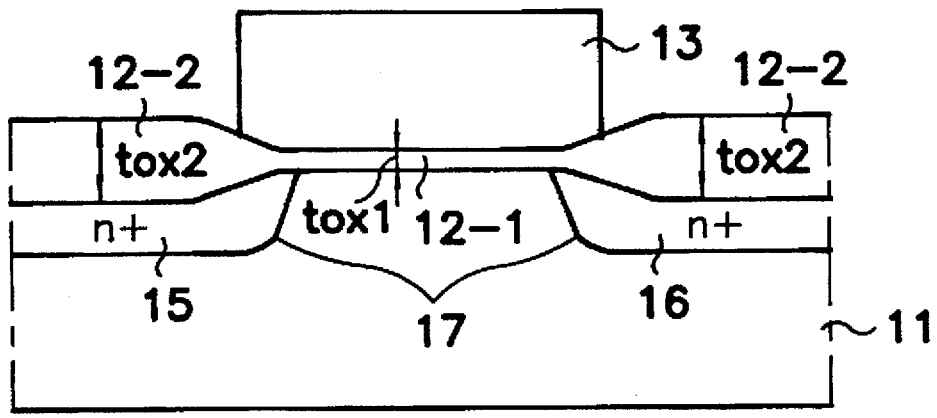
FIG. 1 is a cross-sectional view of a conventional MOS transistor.
Figure 2A:
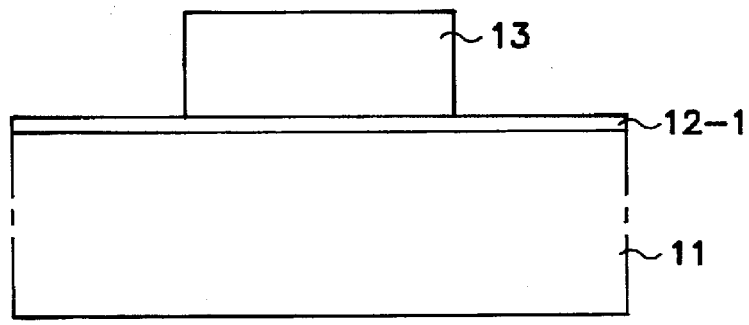
FIGS. 2(a) to 2(c) show process steps in fabricating the conventional MOS transistor shown in FIG. 1.
Figure 2B:
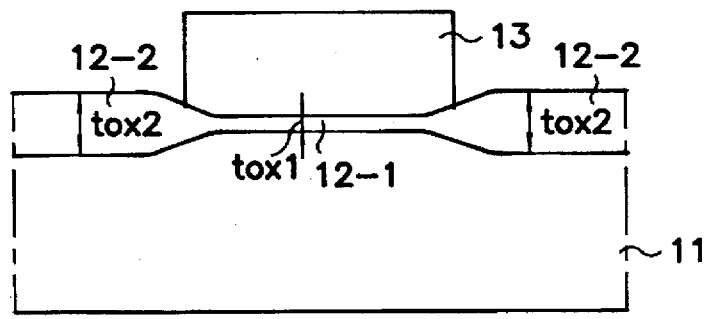
Figure 2C:
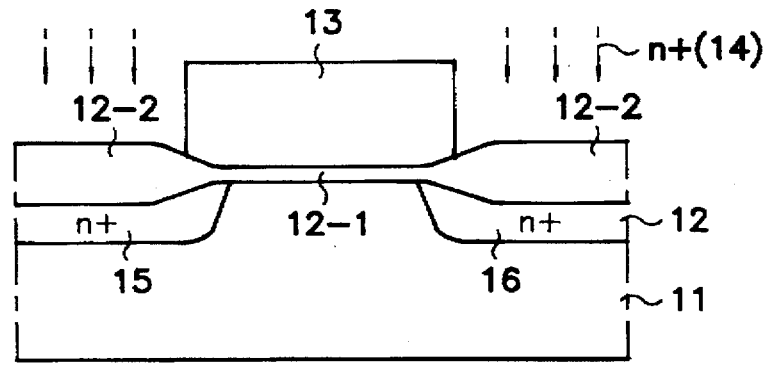
Figure 3:
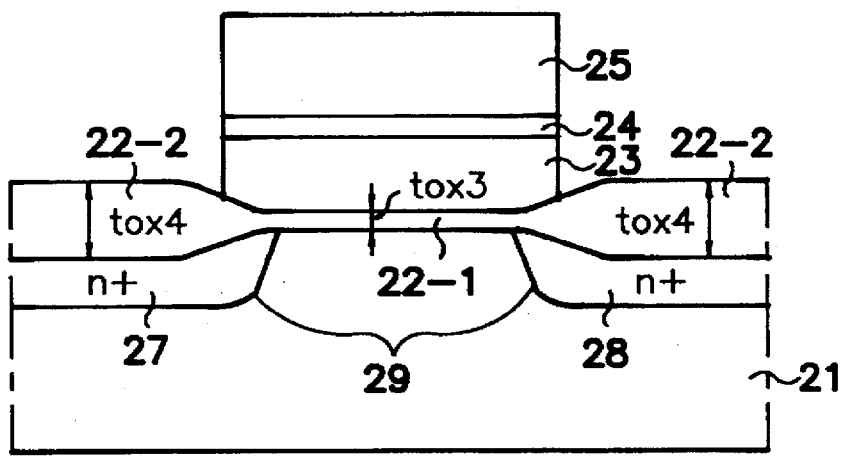
FIG. 3 is cross-sectional view of a conventional flash-EEPROM transistor.
Figure 4:
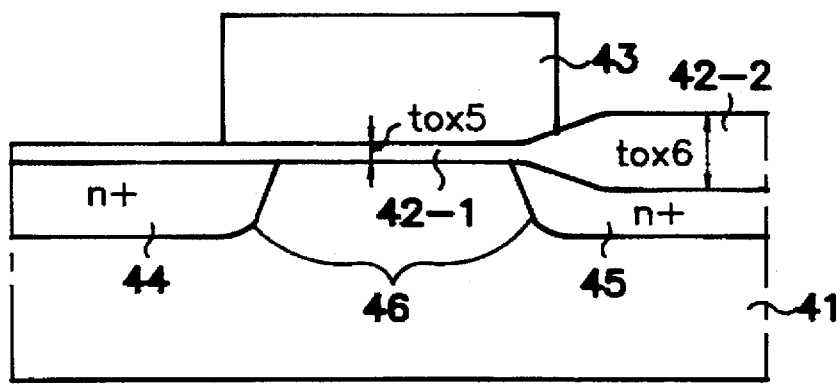
FIG. 4 is a cross-sectional view of an MOS transistor in accordance with a first embodiment of the present invention.

FIG. 4 illustrates an MOS transistor in accordance with a first embodiment of the present invention including n+ conductivity type source and drain regions 44 and 45, respectively, spaced from each other by a channel region 46 in p-type substrate 41. An insulation film 42 is formed over the entire surface of the substrate and a gate 43 is formed on insulation film 42 over channel region 46.

Insulation film 42, preferably an oxide, includes a thin portion, 42-1, having a fixed thickness designated by $tox_5$ in FIG. 4; and a thick portion 42-2, having a thickness designated by $tox_6$ in FIG. 4. The thickness of oxide portion 42-2 is similar to that of a field oxide.

As further shown in FIG. 4, oxide portion 42-2 is thicker than oxide portion 42-1. In addition, oxide portion 42-2 is formed on drain region 45, while oxide portion 42-1 is provided on channel region 46 and source region 44.

Since the thick oxide portion 42-2 is formed on drain region 45, the MOSFET according to the first embodiment of the present invention has reduced GIDL current. On the other hand, since a thin oxide (oxide portion 42-1) is provided on source region 44, the source resistance is reduced, resulting in improved current driving capability of the device.

Further in accordance with the present invention, a process for fabricating the MOS transistor shown in FIG. 4 will now be described with reference to FIGS. 5(a) to 5(d). As will be discussed below, this process includes the step of oxidation using oxidation accelerating material.

Figure 5A:
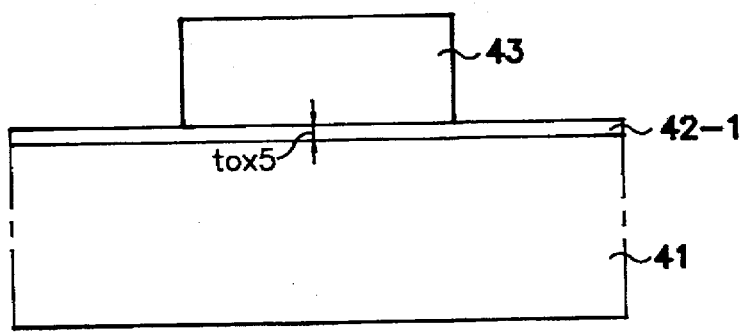
FIGS. 5(a) to 5(d) illustrate process steps in fabricating the MOS transistor shown in FIG. 4 in accordance with an aspect of the present invention.

As seen in FIG. 5(a), a first oxide film 42-1 is grown on p-type semiconductor substrate 41, preferably a silicon substrate, by thermal oxidation. Next, a polysilicon film is deposited on oxide film 42-1 and patterned using a photo-etching process to form gate electrode 43.

Figure 5B:
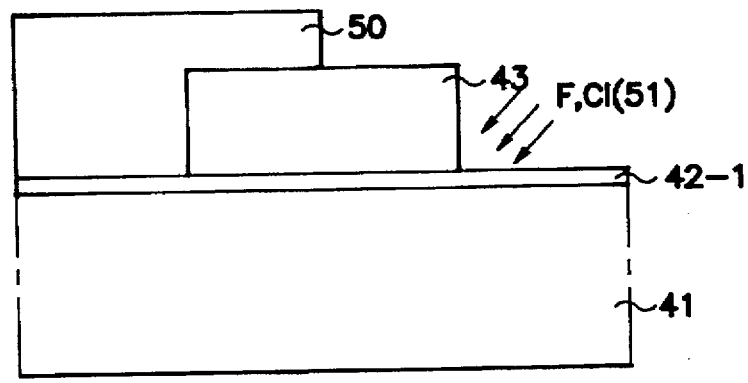

As shown in FIG. 5(b), a photoresist film 50 is provided on the surface of the substrate and patterned to expose a portion of gate 43 and oxide film 42-1. With photoresist film 50 and gate electrode 43 as an implantation mask, oxidation accelerating material 51 is implanted into exposed regions of oxide film 42-1 using high tilt-angle ion implantation. Preferably, halogen ions such as ions of chlorine and fluorine are used as the oxidation accelerating material.

Figure 5C:
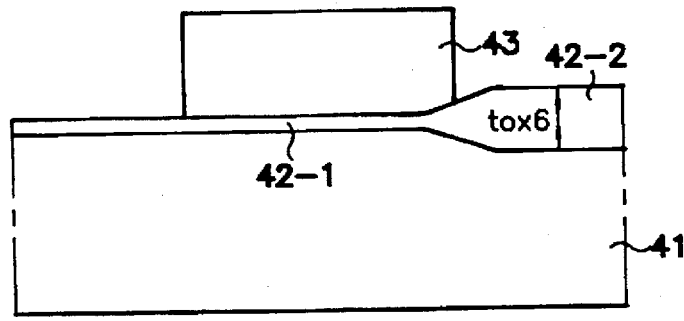
Figure 5D:
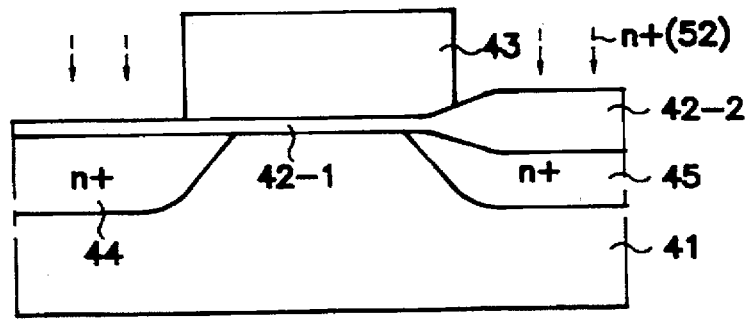

As shown in FIG. 5(c), photoresist layer 50 has been removed, and a polysilicon oxidation process is carried out to form a thick oxide portion 42-2. Due to the presence of the oxidation accelerating material 51, the oxide in the region to the right of gate electrode 53 in FIG. 5(c) grows faster than remaining portions on the surface of the substrate (e.g., to the left of gate electrode 43 in FIG. 5(c). As a result, thick oxide portion 42-2, having a thickness typical of a field oxide, is formed to the right of gate electrode 43 in the FIG. 5(c), while oxide portion 42-1 remains relatively thin, having a thickness similar to that of a gate insulation film. As seen in FIG. 5(d), high impurity concentration source and drain regions 44 and 45, respectively, are formed on opposite sides of gate electrode 43 by ion implantation of n-type impurities 52. In this step, gate electrode 43 serves as an implantation mask.

FIGS. 6(a) to 6(d) illustrate an alternative method according to the present invention for fabricating the MOS transistor shown in FIG. 4. According to this method, however, oxidation inhibiting material is used instead of oxidation accelerating material, as discussed above with respect to the process shown in FIGS. 5(a) to 5(d).

Figure 6A:
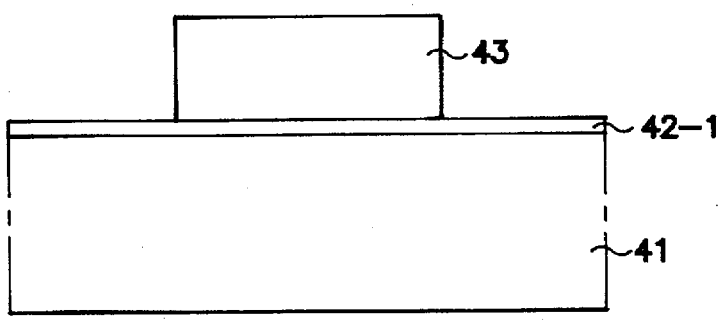
FIGS. 6(a) to 6(d) illustrate alternative process steps in fabricating the MOS transistor shown in FIG. 4 in accordance with a further aspect of the present invention.

As shown in FIG. 6(a), a first oxide film 42-1 is gown on substrate 41 by thermal oxidation, and a gate polysilicon film 43 is subsequently formed on oxide 42-1.

Figure 6B:
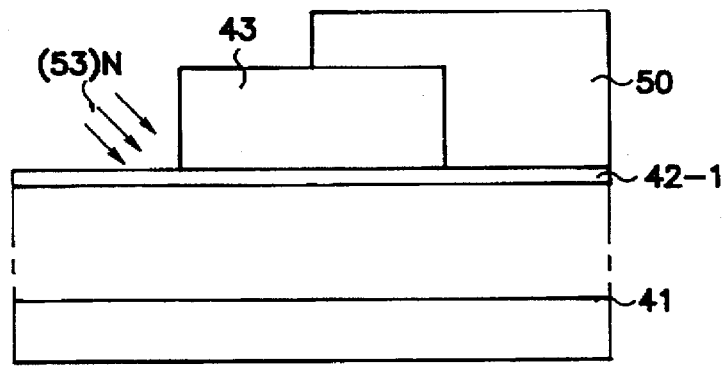

As seen in FIG. 6(b), photoresist layer 50 is provided on the surface of the substrate and patterned to expose portions of oxide 42-1 and gate electrode 43. Note that in FIG. 6(b), photoresist layer 50 is provided on the right side of gate electrode 43, while in FIG. 5(b) it is provided on the left side. Next, oxidation inhibiting material (preferably nitrogen ions) is preferably implanted at a high tilt-angle into the exposed portions of oxide 42-1 (gate electrode 43 and photoresist layer 50 serving as an implantation mask). Alternatively, instead of high tilt-angle implantation, nitrogen incorporation into the exposed portions of oxide film 42-1 may be achieved by heat treatment in an ammonia ($NH_3$) atmosphere.

Figure 6C:
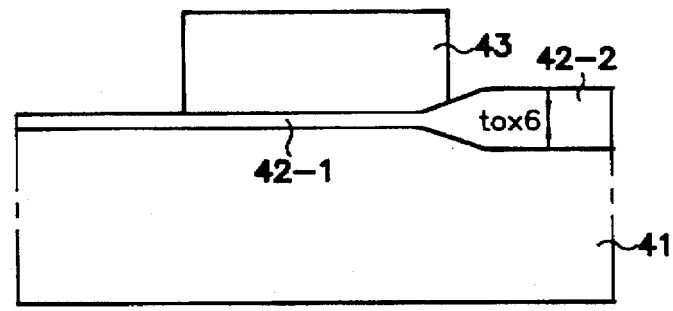

As shown in FIG. 6(c), photoresist layer 50 is removed and a relatively thick oxide is grown by a polysilicon oxidation process. The thick oxide 42-2 grows only on those portions of oxide film 42-1 which were shielded from the oxidation inhibiting material. That is, oxide growth is significantly greater in the shielded regions of oxide film 42-1 than those portions which were exposed to the oxidation inhibiting material.

Figure 6D:
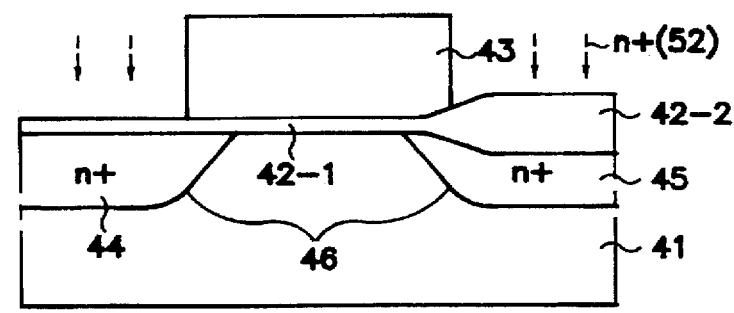

As shown in FIG. 6(d), high impurity concentration source and drain regions 44 and 45, respectively, are formed in substrate 41, preferably by ion implantation of n-type impurities using gate 43 as an implantation mask.

Figure 7:
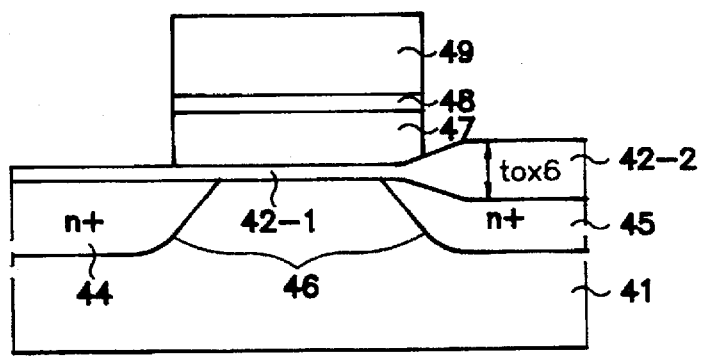
FIG. 7 is a cross-sectional view of a flash-EEPROM in accordance with a second embodiment of the present invention.

FIG. 7 illustrates a cross-sectional view a flash-EEPROM transistor in accordance with a second embodiment of the present invention.

A flash-EEPROM transistor according to the present invention preferably includes a p type substrate 41 having a channel region 46 spaced between n+ source and drain regions 44 and 45, respectively. An insulation film 42 is formed on the surface of substrate 41 having a thin portion 42-1 provided over the source and channel regions 44 and 46, respectively, and a thick portion disposed over drain region 45. As shown in FIG. 7, the thickness of oxide film portion 42-2 is designated $tox_6$.

The flash-EEPROM transistor in accordance with the present invention further includes a floating gate 47 and a control gate 49 with an interlayer insulation film 48 formed therebetween. Interlayer insulation film 48 insulates the floating gate 47 from control gate 49.

During programming of the flash-EEPROM transistor, hot electrons are injected from drain region 45 onto floating gate 47. Even though oxide film 42-2 over drain region 45 is thick, hot electron injection is not affected because it is not sensitive to the electric field in the drain. During erasing, however, electrons on floating gate 47 tunnel through thin oxide film 42-1 by the Fowler-Nordheim tunneling process to source region 44, thereby discharging floating gate 47.

Thus, since the a thin oxide is provided over the source region in the flash-EEPROM transistor according to the present invention, erasing speed is improved while maintaining a suitable programming speed. In addition, the junction structure of the source region is simplified and the device may be erased at low voltage.

During fabrication of the flash-EEPROM transistor according to the present invention, the patterned polysilicon floating gate, interlayer insulation film and control gate, may be used as a masking layer for growing thick oxide portions 42-2.

In a 256 megabit process, the gate oxide may be grown, for example, to a thickness of 70 Å, and the oxide thicknesses over the source and drain regions may be, for example, 100 Å and 150 Å, respectively. These oxide thicknesses are achieved under the following process conditions: (1) the gate oxide is removed from exposed portions of the source and drain regions when the polysilicon gate electrode is etched; and (2) fluorine or chlorine ions are implanted into the drain region to increase the oxidation rate 50% over that of the non-implanted source region.

Figure 8:
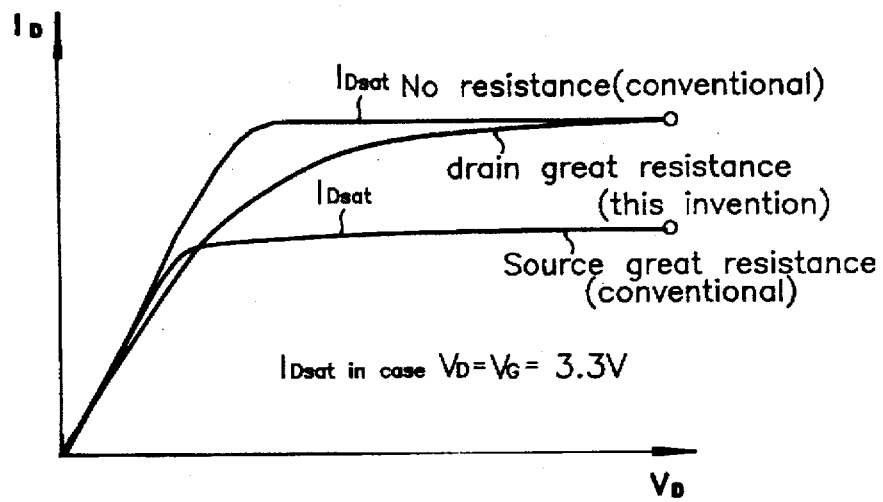
FIG. 8 is a graph depicting $I_D$ vs. $V_D$ for an MOS transistor in accordance with the present invention.
Figure 9:
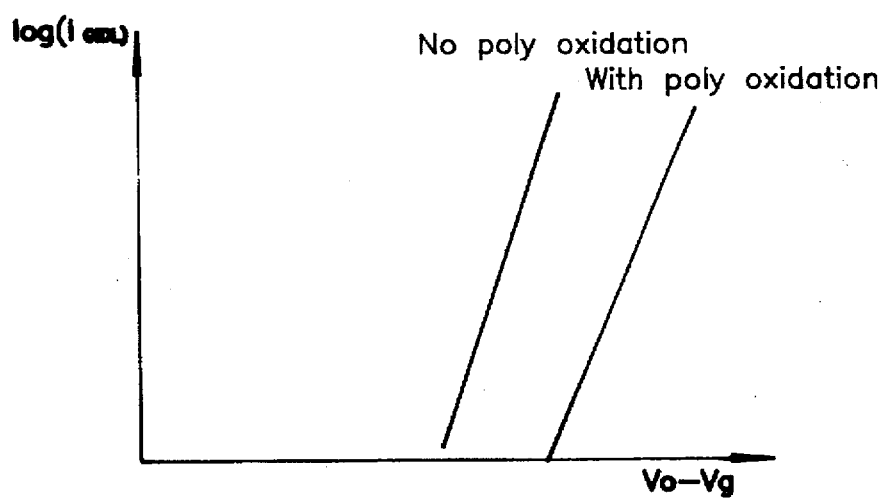
FIG. 9 is a graph illustrating $I_{GIDL}$ vs. $V_{D-VG}$ for an MOS transistor in accordance with the present invention.

FIG. 8 illustrates a plot of drain current $I_D$ vs. drain voltage $V_D$ for an MOS transistor in accordance with the present invention. FIG. 9 is a graph showing log ($I_{GIDL}$) vs. $V_D$-$V_G$, also for an MOS transistor according to the present invention.

FIGS. 8 and 9 will now be described in more detail with reference to the following formulas:

$$Es=(V_{DG}-1.2)/3 \; Tox; \text{ and} \quad (1)$$

$$I_{GIDL}=A \; Es \; Exp(-B/Es). \quad (2)$$

Where:

A and B are constants;

Es is the electric field between the gate and drain;

Tox is the gate insulation film thickness in that portion of the transistor where the gate electrode and drain region overlap; and $I_{GIDL}$ is the gate induced drain leakage current.

As can be seen in equations (1) and (2), $I_{GIDL}$ increases exponentially as the gate insulation film decreases. Thus, an increase in the gate insulation film thickness (where the gate and drain overlap) by a factor of 50% results in an actual reduction of $I_{GIDL}$ by a factor less than 1/100.

This feature of the present invention is shown in FIG. 9, where $I_{GIDL}$ is reduced significantly for a device in which polysilicon oxidation is performed on the drain region, relative to a device in which no polysilicon oxidation was performed.

FIG. 8 further illustrates the advantages of the present invention by comparing the $I_D$ vs. $V_D$ curves for: a conventional MOS transistor having no source and drain resistance; an MOS transistor according to the present invention having high drain resistance and low source resistance; and a conventional MOS transistor having a high source resistance. The saturation currents $I_{DSAT}$ are also shown in FIG. 8 as being high for the transistor according to the present invention (having high drain resistance and low source resistance) and low for the conventional transistor (having high resistance for both the source and drain). In addition, the saturation current of the transistor according to the present invention has nearly the same saturation current as a conventional transistor having low resistance source and drain regions. As discussed above, however, such a conventional transistor would suffer from high GIDL currents.

Improved saturation current is achieved as a result of the reduced source resistance in the transistor according to the present invention. The improved saturation current, as shown in FIG. 8, for example, translates into improved current driving ability and increased speed.

Thus, the transistor according to the present invention has reduced GIDL current due to the presence of a relatively thick oxide film on the drain. Also, improved current driving ability and increased speed is realized due to the relatively thin oxide film formed on the source. These results have not been achieved in conventional MOS transistors having the same oxide thickness over both the source and drain regions.

Further, the flash-EEPROM according to the present invention has improved erasing speed due to Fowler-Nordheim tunneling into the source region through a thin gate oxide film. In addition, the junction structure in the source region of the device is simplified because erasure can be achieved at low voltages.

It will be apparent to those skilled in the art that various modifications and variations can be made in the MOS transistor of the present invention and in construction of this MOS transistor without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An EEPROM cell comprising:
    a semiconductor substrate having a primary surface and a first conductivity type;
    a drain region being formed in said primary surface of said semiconductor substrate, said drain region having a second conductivity type;
    a source region being formed in said primary surface of said semiconductor substrate spaced from said drain region, said source region having the second conductivity type;
    an insulation film formed on said primary surface, said insulation film having a first portion extending over said drain region and a second portion extending over said source region, a thickness of said first portion of said insulation film being greater than a thickness of said second portion of said insulation film;
    a first gate electrode formed on said insulation film, said first gate electrode overlying a portion of said primary surface of said semiconductor substrate between said source and drain regions;
    an interlayer insulation film formed on said first gate electrode; and
    a second gate electrode formed on said interlayer insulation film,
    wherein said EEPROM cell is adapted to be programmed by injecting charge carriers from said drain region onto said first gate electrode through said first portion of said insulation film.

2. An EEPROM cell according to claim 1, wherein said insulation film is an oxide.

3. An EEPROM cell according to claim 1, wherein said portion of said primary surface of said semiconductor substrate between said source and drain regions is a channel region.

4. An EEPROM cell according to claim 1, wherein said EEPROM cell is a flash-EEPROM cell.

5. An EEPROM cell according to claim 1, wherein said first and second gate electrodes include polysilicon.

6. An EEPROM cell according to claim 1, wherein said first gate electrode is a floating gate, and said second gate electrode is a control gate.

7. An EEPROM cell according to claim 1, wherein said first conductivity type is p-type and said second conductivity type is n-type.

8. An EEPROM cell comprising:
    a semiconductor substrate having a first conductivity type, said semiconductor substrate having a primary surface;
    a channel region formed in said primary surface of said semiconductor substrate, said channel region having the first conductivity type;
    a drain region formed in said primary surface of said semiconductor substrate and having a second conductivity type, said drain region being located adjacent said channel region;
    a source region formed in said primary surface of said semiconductor substrate end having a second conductivity type, said source region being located adjacent said channel region opposite said first semiconductor region; and
    an insulation film being provided over said primary surface of said substrate, said insulation film including:
        a first portion overlying said channel region and said source region and having a first thickness; and
        a second portion overlying said drain region and having second thickness, said second thickness being greater than said first thickness;
    a first gate electrode formed on said insulation film, said first gate electrode overlying a portion of said primary surface of said semiconductor substrate between said source and drain regions;
    an interlayer insulation film formed on said first gate electrode; and
    a second gate electrode formed on said interlayer insulation film,
    wherein said EEPROM cell may be programmed by injecting charge carriers from said drain region onto said first gate electrode through said first portion of said insulation film.

* * * * *

UNITED STATES PATENT AND TRADEMARK OFFICE
CERTIFICATE OF CORRECTION

PATENT NO. : 5,684,317
DATED : November 4, 1997
INVENTOR(S) : Hyun Sang HWANG

It is certified that error appears in the above-indentified patent and that said Letters Patent is hereby corrected as shown below:

In Claim 8, Col. 8, line 41, "end" should read --and--.

Signed and Sealed this

Seventh Day of April, 1998

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,684,317
DATED : November 4, 1997
INVENTOR(S) : Hyun Sang HWANG

It is certified that error appears in the above-indentified patent and that said Letters Patent is hereby corrected as shown below:

On the Title Page, Item [73], in the Assignee, "L. G. Electronics Inc." should read --LG Semicon Co., Ltd.--.

*In Claim 8, Col. 8, line 41, "end" should read --and--.

Signed and Sealed this

Second Day of June, 1998

*Attest:*

BRUCE LEHMAN

*Attesting Officer*      *Commissioner of Patents and Trademarks*